(12) United States Patent  
Kyösti et al.

(10) Patent No.: US 8,954,014 B2  
(45) Date of Patent: Feb. 10, 2015

(54) OVER-THE AIR TEST (75) Inventors: Pekka Kyösti, Jokirinne (FI); Jukka-Pekka Nuutinen, Martinniemi (FI); Tommi Jämsä, Oulu (FI)

(73) Assignee: Anite Telecoms Oy, Oulu (FI)

( * ) Notice: Subject to any disclaimer, the term of this patent is extended or adjusted under 35 U.S.C. 154(b) by 273 days.

(21) Appl. No.: 13/503,442

(22) PCT Filed: Oct. 26, 2009

(86) PCT No.: PCT/FI2009/050859
§ 371 (c)(1),
(2), (4) Date: Jun. 4, 2012

(87) PCT Pub. No.: WO2011/051537
PCT Pub. Date: May 5, 2011

(65) Prior Publication Data
US 2012/0244818 A1    Sep. 27, 2012

(51) Int. Cl.
*H04B 17/00* (2006.01)
*G01R 29/08* (2006.01)
*G01R 31/00* (2006.01)

(52) U.S. Cl.
CPC ........ *G01R 29/0814* (2013.01); *H04B 17/0092* (2013.01); *G01R 31/001* (2013.01)
USPC ............... 455/67.11; 455/67.1; 455/67.15; 455/77; 455/226.3; 455/423; 455/562.1; 455/522; 455/101; 455/88; 455/507; 375/224; 375/267; 375/350; 375/220; 375/130; 370/335; 370/315; 370/316; 370/334; 370/310

(58) Field of Classification Search
USPC .......... 455/67.15, 77, 226.3, 423, 562.1, 522, 455/101, 88, 507, 115.4, 67.11, 67.13; 375/224, 267, 350, 220, 130, 347, 295; 370/335, 315, 316, 334, 310, 241, 329, 370/208, 232, 233
See application file for complete search history.

(56) References Cited

U.S. PATENT DOCUMENTS 6,208,841 B1    3/2001    Wallace et al.
2002/0034169 A1    3/2002    Ozluturk et al.
(Continued)

FOREIGN PATENT DOCUMENTS

CN    101500254 A    1/2008
EP    1 392 004 A2    2/2004
(Continued)

OTHER PUBLICATIONS

Ville Mottonen, International Search Report for corresponding International Application No. PCT/FI2009/050859, p. 1-3 (Jun. 24, 2010).
(Continued)

*Primary Examiner* — Ganiyu A Hanidu
(74) *Attorney, Agent, or Firm* — Arent Fox LLP (57) ABSTRACT

A testing system comprises a noise source coupled to at least two antenna elements. The noise source forms a total noise power on the basis of a total signal power received by the emulator, a gain of at least one antenna-specific channel between the emulator and the antenna elements, and a desired signal-to-noise ratio. The noise source transmits noise at the total noise power from the at least two antenna elements to the device under test wirelessly.

11 Claims, 4 Drawing Sheets

(56) References Cited

U.S. PATENT DOCUMENTS

| | | | |
|---|---|---|---|
| 2003/0176169 A1* | 9/2003 | Pajukoski et al. | 455/77 |
| 2003/0236089 A1* | 12/2003 | Beyme et al. | 455/423 |
| 2005/0267715 A1* | 12/2005 | Kolu et al. | 702/189 |
| 2006/0088084 A1* | 4/2006 | Sarkkinen | 375/224 |
| 2007/0254643 A1 | 11/2007 | Garcia et al. | |
| 2008/0056340 A1 | 3/2008 | Foegelle | |
| 2009/0094492 A1 | 4/2009 | Music et al. | |
| 2009/0116456 A1* | 5/2009 | Nuutinen et al. | 370/335 |
| 2009/0318103 A1* | 12/2009 | Feenaghty et al. | 455/226.3 |
| 2010/0093300 A1 | 4/2010 | Nuutinen et al. | |
| 2010/0177836 A1 | 7/2010 | Ylitalo | |
| 2011/0084887 A1* | 4/2011 | Mow et al. | 343/703 |

FOREIGN PATENT DOCUMENTS

| | | | |
|---|---|---|---|
| TW | 200849862 A | 12/2008 | |
| WO | WO03039046 A1 | 5/2003 | |
| WO | 03069814 A2 | 8/2003 | |
| WO | 2009061971 A2 | 5/2009 | |
| WO | 2010139840 A1 | 12/2010 | |

OTHER PUBLICATIONS

Official Action issued regarding Taiwan Patent Application No. 099131987, Feb. 6, 2013, 7 pages.

Official Action issued regarding South Korean Application No. 10-2012-7012414, Mar. 21, 2013, 4 pages.

Rohde & Schwarz, "Cost-Effective Over-The-Air Performance Measurements on MIMO Devices", 3GPP TSG RAN WG4 (radio) meeting #51, R4-091710, May 4-8, 2009; pp. 1-5.

European Extended Search Report, Application No. 09850766.8-1504, 5 pages, Sep. 5, 2014.

Stephen Basuki, "Utilization of Channel Emulation to Accurately Characterize the Effects of Multi-Channel RF Interactions on MIMO-Based Systems", Global Mobile Congress 2009, IEEE, Piscataway, NJ, US, Oct. 12, 2009, pp. 1-6.

Canadian Office Action, Application No. 2,777,882, dated Apr. 25, 2014, 3 pages.

Kyosti, P. et al, "MIMO OTA test concept with experimental and simulated vertification", Antennas and Propagation (EuCAP), 2010 Proceedings of the Fourth European Conference on, IEEE, Piscataway, NJ, US, Apr. 12, 2010, pp. 1-5, XP031705569, ISBN: 978-1-4244-6431-9.

Rohde & Schwarz, "Cost-Effective Over-the-Air Performance Measurements on MIMO Devices", 3GPP Draft; R4-091710, 3rd Generation Partnership Project (3GPP), Mobile Competence Centre; 650, Route Des Lucioles; F-06921 Sophia-Antipolis Cedex; France, no. San Francisco; 20090504, May 4, 2009, XP050342455.

Extended European Search Report, Application No. 13154331.6-1855, Dated Sep. 29, 2014, 8 pages.

\* cited by examiner

OVER-THE AIR TEST

CROSS-REFERENCE TO RELATED APPLICATIONS

This application is a National Stage application of International Application No. PCT/FI2009/050859, filed Oct. 26, 2009, which is incorporated by reference herein in its entirety.

BACKGROUND

1. Field

The invention relates to an over-the-air testing of a device in an anechoic chamber.

2. Description of the Related Art

When a radio frequency signal is transmitted from a transmitter to a receiver, the signal propagates in a radio channel along one or more paths having different angles of arrivals, signal delays, polarizations and powers, which cause fadings of different durations and strengths in the received signal. In addition, noise and interference due to other transmitters interfere with the radio connection.

A transmitter and a receiver can be tested using a radio channel emulator emulating real circumstances. In a digital radio channel emulator, a channel is usually modeled with an FIR filter, which generates convolution between the channel model and an applied signal by weighting the signal, which is delayed by different delays, with channel coefficients, i.e. tap coefficients, and by summing the weighted signal components. The channel coefficients are functions of time that correspond to the temporal behavior of a real channel. A traditional radio channel emulation test is performed via a conducted connection such that a transmitter and a receiver are coupled together via a cable.

Communication between a subscriber terminal and a base station of a radio system can be tested using an OTA (Over The Air) test, where a real subscriber terminal is surrounded by a plurality of antenna elements of an emulator in an anechoic chamber. The emulator may be coupled to or act as a base station and emulate paths between the subscriber terminal and the base station according to a channel model.

However, a test with a desired signal-to-noise ratio cannot be properly carried out in the OTA chamber. Hence, there is a need for a better testing system.

SUMMARY

An object of the invention is to provide an improved solution.

According to an aspect of the invention, there is provided a method of communicating wirelessly with an electronic device under test surrounded by antenna elements, the communication being performed through a simulated radio channel of an emulator. The method comprises transmitting wirelessly noise at a total noise power from at least two antenna elements to a device under test, the total noise power being based on a total signal power received by the emulator, a gain of at least one antenna-specific channel between the emulator and antenna elements, and a desired signal-to-noise ratio.

According to another aspect of the invention, there is provided a testing system for communicating wirelessly with an electronic device under test surrounded by a plurality of antenna elements at least one of which is connected to an emulator which is configured to form a simulated radio channel for the communication. The testing system comprises a noise source coupled to at least two antenna elements; and the noise source is configured to form a total noise power on the basis of a total signal power received by the emulator, a gain of at least one antenna-specific channel between the emulator and the antenna elements, and a desired signal-to-noise ratio; transmit wirelessly noise at the total noise power from the at least two antenna elements to the device under test.

The invention provides several advantages. A desired intensity with a desired noise distribution over frequency may be added to the transmission directed towards the DUT.

BRIEF DESCRIPTION OF THE DRAWINGS

In the following, the invention will be described in greater detail with reference to the embodiments and the accompanying drawings, in which.

DETAILED DESCRIPTION

Figure 1:
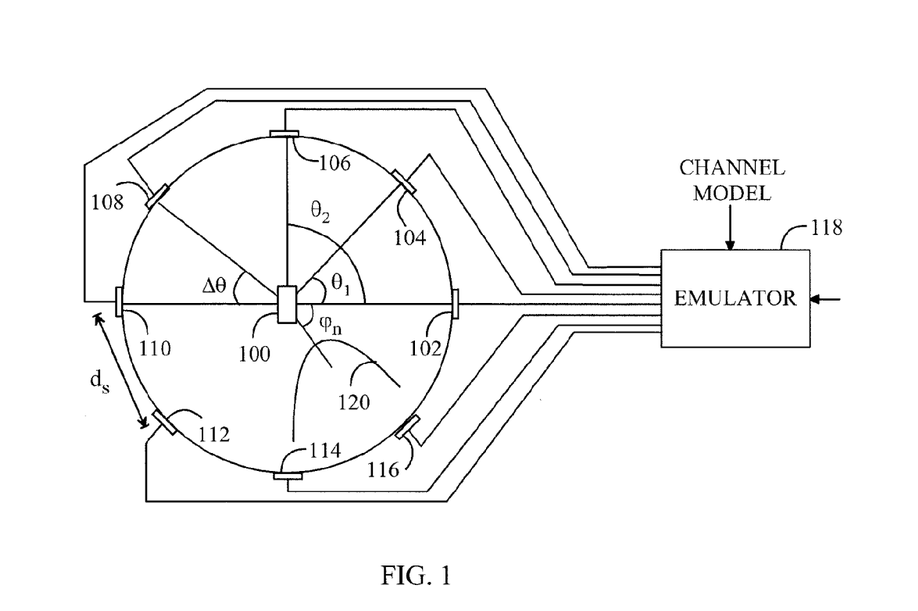
FIG. 1 shows a measurement configuration in an OTA test chamber.

FIG. 1 presents an OTA test chamber. A DUT 100, which may be a subscriber terminal, is in the centre and antenna elements 102, 104, 106, 108, 110, 112, 114 and 116 are around the DUT 100 at a uniform spacing (e.g. 45° between each of the 8 elements). Let us denote the directions of K OTA antennas with $\theta_k$, k=1, . . . , K and the spacing of an antenna in the angle domain with $\Delta\theta$, where K refers to the number of antenna elements 102 to 116. The angle $\Delta\theta$ expresses a measure of the separation of two antenna elements 102 to 116 with respect to the electronic device 100. Each of the antenna elements may be connected to a single emulator output port of an emulator 118 such as EB (Elektrobit) Propsim® C8 and hence each antenna element may receive one antenna-specific channel from the emulator 118. In general, at least one antenna element 102 to 116 is coupled to the emulator 118.

The test chamber may be an anechoic room. The emulator 118 may comprise at least one FIR filter for forming each antenna-specific channel. Additionally or alternatively, the emulator 118 may comprise a processor, a memory and a suitable computer program for providing the antenna-specific channels. The separation angle $\Delta\theta$ may be the same or different for any two successive antenna elements 102 to 116.

As distinct from the same distance between the DUT 100 and the antenna elements 102 to 116, the antenna elements 102 to 116 may also be at different distances from the DUT 100. Correspondingly, the antenna elements 102 to 116 may only be placed in a sector instead of being placed at a full angle or a full solid angle. The DUT 100 may also have one or more elements in the antenna.

The emulator 118 has a radio channel model for the test. The radio channel model may be selected by a person accomplishing the test. The radio channel model used may be a playback model based on a channel recorded from a real radio system or it may be an artificially generated model or it may be a combination of a playback model and an artificially generated model.

Assume now that the emulator 118 is coupled to a base station of a radio system or the like and the antenna elements 102 to 116 are transmitting to the DUT 100, which acts as the receiving subscriber terminal of the radio system or the like. It may be assumed that DUT antenna characteristics are unknown and thus information may be ignored.

Let us first examine the transmission of signals in the OTA chamber. A geometric radio channel model in the emulator 118 may be mapped on the OTA antenna elements 102 to 116 such that each antenna element 102 to 116 receives a signal of an antenna-specific channel from the emulator 118 and transmits it wirelessly to the DUT 100. The emulator 118 simulates transmission from the base station with a multipath propagation. Since each signal associated to a path, i.e. to a delay, may come to the DUT 100 from the same or from a different direction, the emulator 118 distributes the signal it receives to each antenna element 102 to 116 according to the radio paths of the channel model at each moment. The radio channel model determines the power and the delay of each antenna-specific signal. In a simple embodiment, a signal of one path may be transmitted to the DUT 100 from one antenna element 102 to 116 only and hence the direction of a beam 120 representing the path has to be approximated with the angle $\theta_k$ of the antenna element 102 to 116 closest to the direction of the path.

When the angle of a beam of a path differs from the angle $\theta_k$ of the antenna element 102 to 116 by more than a threshold value, which may be for example 1°, the beam may be transmitted using at least two antenna elements 102 to 116.

In an embodiment, the power of a signal of a simulated path may be divided between two antenna elements on the basis of antenna angles $\theta_k$ and an angle $\phi_n$ of a direction of the path. The emulator 118 may find the angle $\theta_k$ of an antenna element k closest to the angle $\phi_n$ of direction of a path according to the following mathematical equation $$\theta_k = \Delta\theta \operatorname{int}\left(\frac{\min_j\left(\theta_j + \frac{1}{2}\Delta\theta - \phi_n\right)}{\Delta\theta}\right), \quad (1)$$

where min means a minimum value of the expression among all values of $\theta_j$, int means an integer value of the division (including 0). The value of k is $$\operatorname{int}\left(\frac{\min_j\left(\theta_j + \frac{1}{2}\Delta\theta - \phi_n\right)}{\Delta\theta}\right).$$

The second antenna element k+1 may then be the one having an angle $\theta_k + \Delta\theta = \theta_{k+1}$. Hence, the selected antenna elements may be those between which the beam of the path at least mainly is directed towards the DUT 100.

If the direction of a beam $\phi_n$ of a path is exactly in the middle of angles $\theta_k$ and $\theta_{k+1}$ of two antenna elements, 50% of the power of the beam is distributed for each.

A weight $w_{n,k}$ for each antenna element 102 to 116 may be calculated in the following manner $$w_{n,k} = 1 - \frac{|\theta_{k+i} - \phi_n|}{\Delta\theta}, \quad (2)$$

where i is either 1 or 2, k is the index of an antenna element closest to the angle $\phi_n$ of a path n. The power $P_n$ of the path n to an antenna element k is multiplied by a weight $w_{n,k}$ such that $P_k + P_{k+1} = P_n$.

Figure 2:
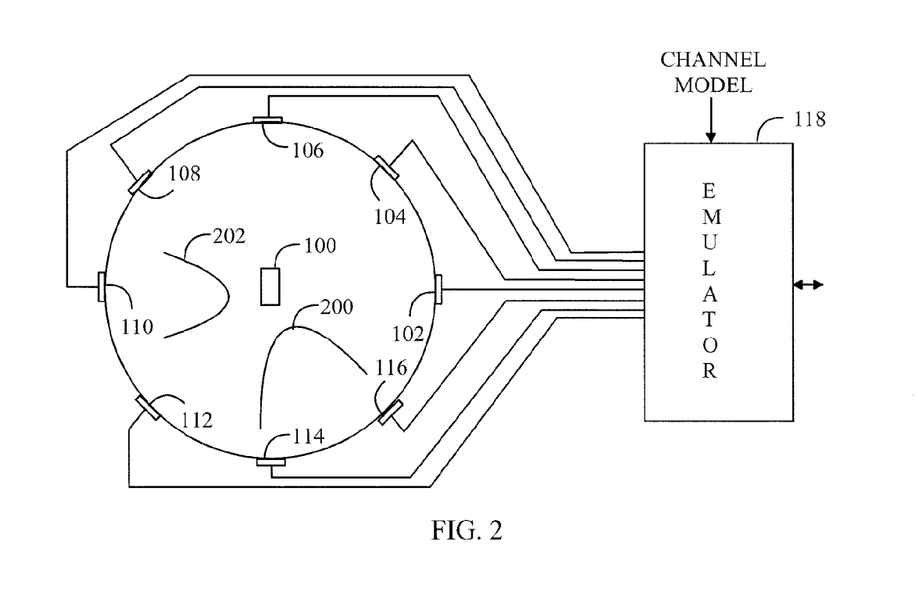
FIG. 2 shows an OTA chamber with two beams in one position.
Figure 3:
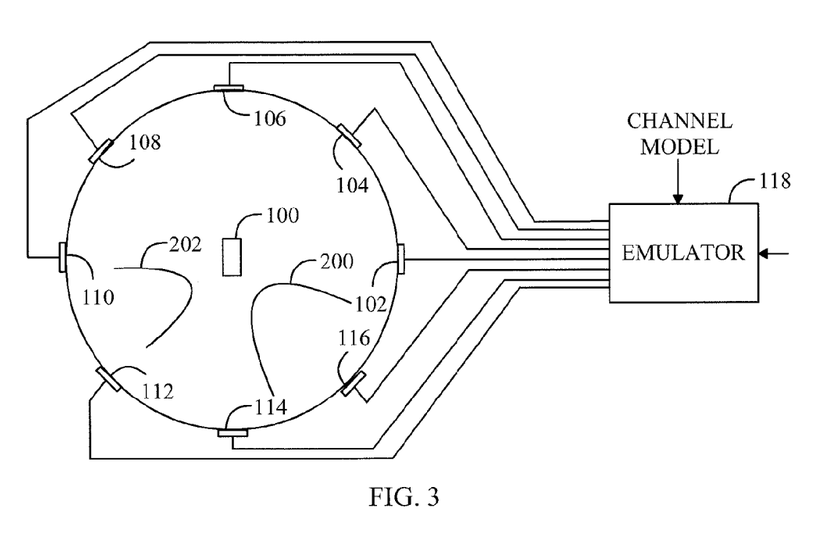
FIG. 3 shows an OTA chamber with two beams shifted to another position.

FIGS. 2 and 3A present a rotation of at least one beam. FIG. 2 presents a moment of communication where the emulator 118 and the antenna elements 102 to 116 have formed two beams 200, 202 on the basis of the channel model. It is assumed in this example that the beam 202 is formed by the antenna element 110 and the beam 200 by the antenna elements 114 and 116 at a first moment.

FIG. 3 presents the very next moment of communication with respect to the moment in FIG. 2. The emulator 118 has rotated the same beams 200, 202 to the next position with respect to the DUT 100 and the antenna elements 102 to 116. The movement of the beams represents the shift of the angular spectrum of the simulated radio channel. This means that the simulated radio channel has not necessarily changed as such but has rotated with respect to the DUT 100 and the antenna elements 102 to 116. The beam 202 is formed by the antenna elements 110 and 112. The beam 200 is formed by the antenna element 116. Instead of shifting each beam 200, 202 by a decrement or an increment equal to the angle $\Delta\theta$ of two antenna elements 102 to 116, the emulator 118 may shift each beam 200, 202 by a value other than that of the angle $\Delta\theta$.

Figure 4:
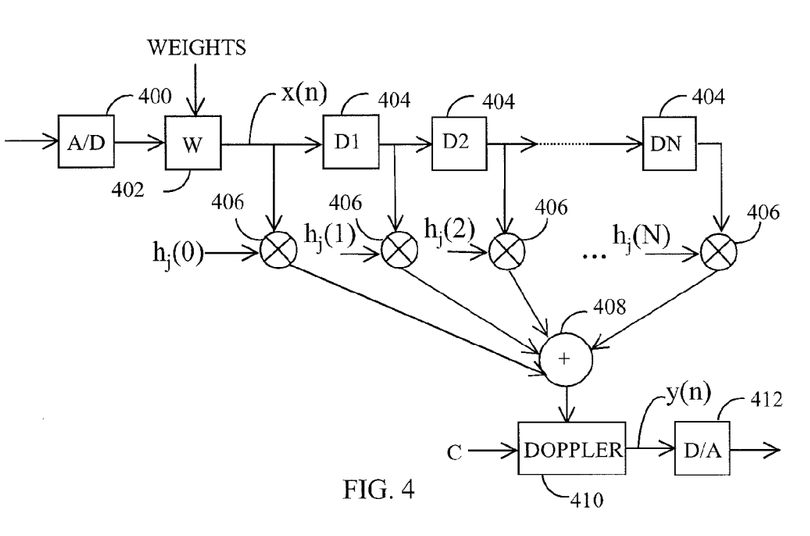
FIG. 4 shows a FIR filter.

FIG. 4 shows a block diagram of a FIR filter which may comprise an analog-to-digital converter 400, a weighting element 402, delay elements 404 arranged as a shift register, multipliers 406, a summer 408, a Doppler element 410 and a digital-to-analog converter 412. The analog-to-digital converter 400 receives an analog signal. The basic function of an FIR filter without the weighting element 402 and the Doppler element 410 is as follows. The digital input signal x(n) from an analog-to-digital converter 400 is delayed in each delay element 404, whose delays may have the same or different length in time, and the delayed signals are multiplied in the multipliers 406 by the desired channel coefficient $h_j(i)$, where i=[0, . . . , N] and j=[1, . . . , K]. A radio channel model is defined by the channel coefficients $h_j$=[h(0), . . . , h(N)], which are also called the channel estimates of the radio channel or tap coefficients of a FIR filter. The signal components are summed in a summer 408 and the summed signal is converted to an analog form in the digital-to-analog converter 412.

In a mathematical form, the output signal y(n) of a FIR filter may be expressed as a convolution of the sum of the product of the delayed signal and the channel coefficients:

$$y(n) = x * h = \sum_{k=1}^{N} h(k) \times (n-k), \quad (3)$$

where * denotes a convolution operation and n denotes the index of a signal element. Signals x and y and a channel impulse response estimate h can be processed in a scalar form, vector form or matrix form. Generally, radio channel coefficients h may be real or complex.

In an embodiment, an FIR filter may comprise an operation of a weighting element 402. Hence, a separate Doppler element 402 is not necessarily needed. The weighting element 400 may be placed anywhere between the analog-to-digital converter 400 and the digital-to-analog converter 412 as long as all delayed signal components are weighted before or after delay. The weighting element 402 may be a multiplier which multiplies the simulated radio channel $H_{n,k}$ by a weight $w_{n,k}$ (see equation (2)) in order to provide a product $w_{n,k}H_{n,k}$.

In an embodiment, the FIR filter may additionally comprise a Doppler element 410. The Doppler element may be a multiplier which multiplies the weighted radio channel $w_{n,k}H_{n,k}$ by a Doppler shift $\exp(j2\pi C_{n,k}t)$ in order to provide a product $w_{n,k}H_{n,k}\exp(j2\pi C_{n,k}t)$. The Doppler element 410 may be placed anywhere between the analog-to-digital converter 402 and the digital-to-analog converter 412 as long as all delayed signal components are Doppler-shifted before or after delay.

Multiplication by different weights $w_{n,k}$, $H_{n,k}$ and $\exp(j2\pi C_{n,k}t)$ may be combined to take place in one multiplier. Rotation of at least one beam with respect to the DUT 100 and the antenna elements 102 to 116 may be accomplished by changing the weights as a function of time.

In addition to the various forms of transmitting signals in the OTA chamber, noise may be transmitted from at least two antenna elements 102 to 116 to the DUT 100. The at least two antenna elements may be antenna elements which are also used to transmit communication signals to the DUT 100 or the at least two antenna elements may not be used to transmit communication signals to the DUT. All antenna elements 102 to 116 may be used to transmit noise, but it is also possible that only a fraction of all antenna elements 102 to 116 are used to transmit noise.

Figure 5:
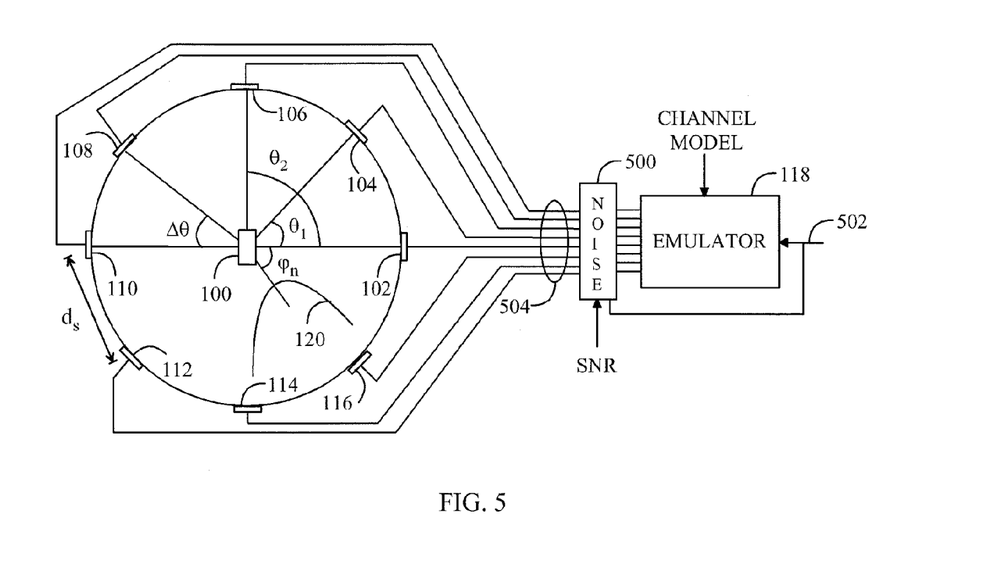
FIG. 5 shows a testing system transmitting noise to the DUT.

FIG. 5 illustrates a testing system transmitting signals and noise to the DUT 100. Like in FIG. 1, a DUT 100 is in the centre and chamber antenna elements 102 to 116 are around the DUT 100 with a uniform spacing or non-uniform spacing. Each of the at least two antenna elements 102 to 116 may be connected to a single output of a noise source 500 which may add noise to the transmission propagating from the emulator 118 to the antenna elements 102 to 116. Each emulator output port of an emulator 118 may be coupled to an input port of the noise source 500 and the noise source 500 may transfer a signal from an input port to an output port of the noise source 500 without changes. Hence, each antenna element may receive one antenna-specific channel 504 directly from the noise source 500 and indirectly from the emulator 118.

The number of the at least two antenna elements 102 to 116 coupled with the noise source 500 may equal to or fewer than the total number of the antenna elements 102 to 116. If fewer than the total number of the antenna elements 102 to 116 are used, the noise source 500 may be coupled to every other antenna element 104, 108, 112 and 116, for instance. The number of antenna elements to which the emulator 118 is coupled may also be fewer than the total number of antenna elements 102 to 116. The emulator 118 may be coupled to antenna elements different from those of the noise source 500. The emulator 118 may be coupled to every other antenna element 102, 106, 110 and 114, for example. The separate antenna elements do not need to be evenly distributed between the emulator 118 and the noise source 500. Generally, when separate antenna elements are used, the at least two antenna elements receive noise directly from the noise source 500 and the rest of the antenna elements receive signals from the emulator 118 through the antenna-specific channels 504.

In an embodiment, it is also possible for the emulator 118 and the noise source 500 to use at least one common antenna element although the antenna elements may otherwise be different. At least one antenna element may be coupled to the noise source 500 although they may not receive a signal from the emulator 118, and at least one different antenna element may be coupled to the emulator 118 although they may not receive noise from the noise source 500, while at least two antenna elements are connected to the emulator 118 through the coupling with the noise source 500 for receiving both noise and signals.

In an embodiment, noise may be transmitted uniformly from all directions towards the DUT 100. In such a case, the average power from the different directions with respect to the DUT 100 should be the same whereby spatial correlation may be decreased. Noise may be transmitted from all the antenna elements 102 to 116 or from antenna elements 102, 108 and 112, for example.

In an embodiment, the noise source 500 of the testing system may form a total noise power on the basis of a total signal power of the signal 502 received by the emulator 118, gain of at least one antenna-specific channel 504 between the emulator 118 and the antenna elements 102 to 116, and a desired signal-to-noise ratio SNR. The noise source 500 may obey the following mathematical expression of the total noise power $|n|_t^2$, for example $$|n|_t^2 = f(|s|^2, |h|^2, SNR) \tag{4}$$

where $f(\bullet)$ is a desired function of parameters $|s|^2$, $|h|^2$ and SNR, $|s|^2$ a total signal power 502 received by the emulator 118, $|h|^2$ represents gains of antenna-specific channels 504, and SNR refers to a desired signal-to-noise ratio.

In an embodiment, total noise power $|n|_t^2$ may be expressed as follows:

$$|n|_t^2 = \frac{f(|s|^2)g(|h|^2)}{SNR}, \tag{5}$$

where $f(|s|^2)$ is a function of a total signal power 502 received by the emulator 118 and $g(|h|^2)$ represents a function of gains of antenna-specific channels 504. When the total noise power $|n|_t^2$ is formed, the noise source 500 may provide a desired noise power distribution over a frequency having the total noise power. The noise source 500 may generate the desired noise power distribution over frequency or retrieve the desired noise power distribution over a frequency from a memory, which may be included in the noise source 500 or which may an external memory.

In an embodiment, a noise power $|n|^2$ for each antenna element 102 to 116 may be formed by dividing the total noise power $|n|_t^2$ by the number K of the antenna elements. When the noise power $|n|^2$ is formed, the noise source 500 may provide the antenna elements 102 to 116 with a desired noise power distribution over a frequency, the desired noise power distribution having the calculated noise power.

In an embodiment, the noise power $|n|^2$ may be expressed in a more specific way as follows:

$$|n|^2 = \frac{\langle |s|^2 \rangle \langle \sum_{i=1}^{K} |h_i|^2 \rangle}{SNR \cdot K}, \tag{6}$$

where $\langle \bullet \rangle$ represents an operation of a time average in a predetermined time window, $|h_i|^2$ represents a gain of a antenna-specific channel i and $$\sum_{i=1}^{K} |h_i|^2$$

represents a sum of the gains of the antenna-specific channels. The number of gains to be summed may refer to all OTA antenna elements 102 to 116 which may transmit a signal to the DUT 100. In general, the number of gains in the summing operation may be at least one. For example, a gain of an antenna-specific channel may be omitted in the summing if its absolute value is below a predetermined threshold or if no signal is transmitted in the channel. The number of gains of the antenna-specific channels taken into account in the summing operation may be different at different moments of time.

In an embodiment, the noise source 500 may transmit noise having the calculated noise power through the at least two antenna elements 102 to 116 to the DUT 100. The total number of the antenna elements 102 to 116 in the OTA chamber and operatively coupled with the emulator 118 may be higher than the number of antenna elements used to transmit noise.

In an embodiment, the noise source 500 may form complex Gaussian noise corresponding to the desired noise power distribution for the total noise power $|n|_t^2$ or the noise power $|n|^2$ of each antenna-specific channel. The noise source 500 may feed the Gaussian noise to the at least two antenna elements 102 to 116. The complex Gaussian noise may be formed by generating the noise in a noise generator or the noise may be retrieved from a memory stored there earlier. Instead of Gaussian noise, also other sort of distributions of noise may be formed.

Figure 6:
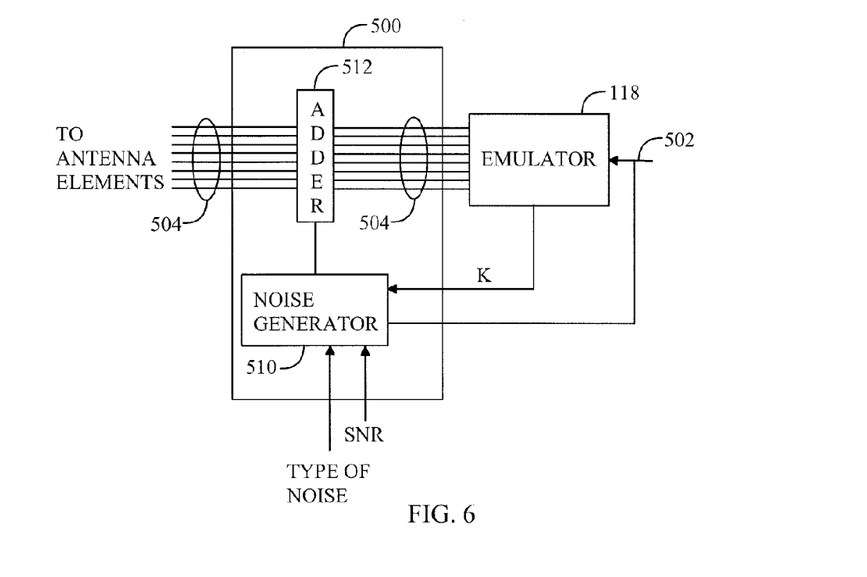
FIG. 6 shows a noise source.

FIG. 6 presents the noise source 500 in more detail. The noise source 500 may comprise a noise generator 510 and an adder 512. However, the adder 512 is not necessarily needed if the noise generator 510 and the emulator 118 use completely different antenna elements. The noise generator 510 generates the desired noise power and the desired distribution of noise and may feed the desired noise to the adder 512 which combines the noise in the antenna-specific channels 504 with the signals from the emulator 118 to the antenna elements 102 to 116. Without the adder 512 the noise generator 510 feeds the desired noise directly to the at least two antenna elements transmitting the noise.

If the antenna elements 102 to 116 are at a different distance from the DUT 100, the distance D of each antenna element k may be taken into account when forming noise power $|n|^2$ of the antenna element k in the following manner, for example, $$|n|_{k,D}^2 = |n|_k^2 \cdot f(D), \quad (7)$$

where f(D) is a suitable function of distance D. The function f(D) may be f(D)=aD$^c$+b, for example. Coefficient a may be about 1, coefficient b may be about 0 and coefficient c may be about 2.

The transmission $y_m(t)$ received by the DUT 100 from the antenna elements 102 to 116 which transmit both signals and noise may be expressed, for instance, as:

$$y_m(t) = \sum_{j=1}^{K} c_{mk}(t)(x_k(t) + n_k(t)), \quad (8)$$

where $c_{mk}(t)$ is a complex channel gain between the antenna elements 102 to 116 and the DUT 100, $x_k(t)$ is a transmitted signal and $n_k(t)$ is intentionally transmitted noise.

Communicating with the DUT 100 over the air enables testing an antenna design, polarization, and effects of different noise distributions, signal-to-noise ratios and positions in such a way that path directions may be freely included in the testing.

Above, the shifting of the simulated radio channel has been described two-dimensionally. In an embodiment, the shifting of the simulated radio channel may, however, be performed three-dimensionally, utilizing antenna elements which have not been placed on a plane in the OTA chamber. The direction of the angular spectrum having at least one beam is then determined in solid angles.

The embodiments may be applied in 3GPP (Third Generation Partnership Project) LTE (Long Term Evolution), WiMAX (Worldwide Interoperability for Microwave Access), Wi-Fi and/or WCDMA (Wide-band Code Division Multiple Access). In the MIMO (Multiple In Multiple Out), which is also a possible application, signals are distributed to antenna elements in a different manner with respect to the present embodiments.

During rotation of the beams around the DUT 100 the transmitted noise need not to be rotated since the noise may be independent of direction. However, the noise may be made dependent on the direction and the noise may be rotated around the DUT 100 in a similar manner to the beams of signal.

Figure 7:
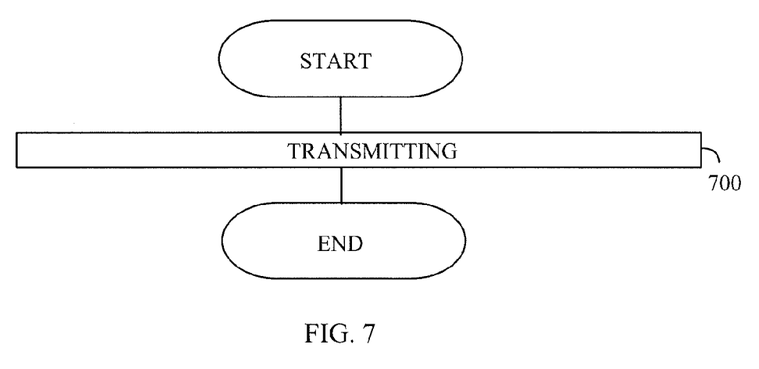
FIG. 7 shows a flow chart of the method.

FIG. 7 presents a flow chart of the method In step 700, noise with a total noise power is transmitted wirelessly from at least two antenna elements 102 to 116 to a device under test 100, the total noise power being based on a total signal power received by the emulator 118, a gain of at least one antenna-specific channel 504 of a connection between the emulator 118 and antenna elements 102 to 116, and a desired signal-to-noise ratio.

The embodiments may be implemented, for instance, with ASIC or VLSI circuits (Application Specific Integrated Circuit, Very Large Scale Integration). Alternatively or additionally, the embodiments of method steps may be implemented as a computer program comprising instructions for executing a computer process for communicating with an electronic device under test through a simulated radio channel of an emulator. The noise source may control, on the basis of the electronic circuits and/or the computer program, the use of the antenna elements for transmitting noise to the DUT.

The computer program may be stored on a computer program distribution medium readable by a computer or a processor. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims.

What is claimed is:

1. A method of communicating wirelessly with an electronic device under test surrounded by antenna elements, the communication being performed through a simulated radio channel of an emulator, the method comprising:
   transmitting noise wirelessly at a total noise power from at least two antenna elements to a device under test,
   the total noise power being based on a total signal power received by the emulator, a gain of at least one antenna-specific channel between the emulator and antenna elements, and a desired signal-to-noise ratio;
   forming a complex Gaussian noise corresponding to a desired noise power distribution of the total noise power; and
   feeding the Gaussian noise to the at least two antenna elements.

2. The method of claim 1, further comprising:
weighting the total signal power with the gain of the at least one antenna-specific channel in order to form a total antenna power;
dividing the total antenna power by the desired value of a signal-to-noise ratio to form the total noise power; and
providing the at least two antenna elements with noise of a desired noise power distribution for transmission over a frequency, the desired noise power distribution having the total noise power.

3. The method of claim 1, further comprising transmitting, by the at least two antenna elements, the noise whose noise power is the total noise power divided by a number of the antenna elements transmitting the noise.

4. The method of claim 1, further comprising forming the total noise power in a predetermined time window on the basis of time averages of the total signal power and the gain of the at least one antenna-specific channel in the predetermined time window.

5. The method of claim 1, further comprising transmitting the noise uniformly from all directions towards the DUT.

6. A testing system for communicating wirelessly with an electronic device under test surrounded by a plurality of antenna elements, at least one of which is connected to an emulator, which is configured to form a simulated radio channel for the communication, the testing system comprising:
a noise source coupled to at least two antenna elements,
the noise source forming a total noise power on the basis of a total signal power received by the emulator, a gain of at least one antenna-specific channel between the emulator and the antenna elements, and a desired signal-to-noise ratio,
the noise source transmitting noise wirelessly at the total noise power from the at least two antenna elements to the device under test.

7. The testing system of claim 6, wherein the noise source weights the total signal power with the gain of the at least one antenna-specific channel in order to form a total antenna power,
the noise source dividing the total antenna power by the desired value of a signal-to-noise ratio to form the total noise power,
the noise source providing the at least two antenna elements with a desired noise power distribution for transmission over a frequency, the desired noise power distribution having the total noise power.

8. The testing system of claim 6, wherein the noise source transmits, through the at least two antenna elements, a noise power having the total noise power divided by a number of antenna elements transmitting the noise.

9. The testing system of claim 6, wherein the noise source forms the total noise power in a predetermined time window on the basis of time averages of the total signal power and the gain of the at least one antenna-specific channel in the predetermined time window.

10. The testing system of claim 6, wherein the noise source generates complex Gaussian noise corresponding to the desired noise power distribution of the total noise power, the noise source feeding the Gaussian noise to the at least two antenna elements.

11. The testing system of claim 6, wherein the testing system transmits the noise uniformly from all directions towards the DUT.

* * * * *